United States Patent
Schlipf et al.

(10) Patent No.: US 10,222,410 B2
(45) Date of Patent: Mar. 5, 2019

(54) DIAGNOSTIC SYSTEM FOR A CONTROLLER

(71) Applicant: Headsight, Inc., Bremen, IN (US)

(72) Inventors: Robert Schlipf, Nappanee, IN (US); Johnathan Rassi, Goshen, IN (US); Nathan Virkler, Phoenix, AZ (US)

(73) Assignee: Headsight, Inc., Bremen, IN (US)

( * ) Notice: Subject to any disclaimer, the term of this patent is extended or adjusted under 35 U.S.C. 154(b) by 210 days.

(21) Appl. No.: 14/767,504

(22) PCT Filed: Feb. 12, 2014

(86) PCT No.: PCT/US2014/016108
§ 371 (c)(1),
(2) Date: Aug. 12, 2015

(87) PCT Pub. No.: WO2014/127046
PCT Pub. Date: Aug. 21, 2014

(65) Prior Publication Data
US 2015/0377945 A1 Dec. 31, 2015

Related U.S. Application Data

(60) Provisional application No. 61/763,907, filed on Feb. 12, 2013.

(51) Int. Cl.
*G01R 31/28* (2006.01)
*G01R 31/11* (2006.01)
(Continued)

(52) U.S. Cl.
CPC ........... *G01R 31/006* (2013.01); *A01D 41/00* (2013.01); *G01R 1/206* (2013.01); *G01R 31/024* (2013.01); *G01R 31/11* (2013.01); *G01R 31/2829* (2013.01)

(58) Field of Classification Search
CPC .... G01R 31/006; G01R 31/024; G01R 31/11; G01R 31/2829; G01R 1/2016; A01D 41/00
(Continued)

(56) References Cited

U.S. PATENT DOCUMENTS 5,268,644 A * 12/1993 Klassen ................. G01R 31/11
324/503
6,677,761 B1 * 1/2004 Greulich ................ G01R 31/11
324/533
(Continued)

*Primary Examiner* — Melissa J Koval
*Assistant Examiner* — Rahul Maini
(74) *Attorney, Agent, or Firm* — Thomas J. Oppold; Larkin Hoffman Daly & Lindgren, Ltd.

(57) ABSTRACT

An electrical circuit for a mobile machine, including an interface coupled between a controller and a plurality of sensors for accurately diagnosing faults in all of the sensor wires and the sensors themselves. This effective resolution reduces the downtime of the mobile machine and operator time by allowing faults to be timely isolated. The interface selectively couples a test signal to each of the sensor conductors, and also selectively couples a responsive returned characteristic signal to the controller, where the returned characteristic signal enables the controller to diagnose each of the plurality of conductors and sensors for faults. The electrical circuit may further include testing circuitry that can specifically determine a location of the determined fault in each of the plurality of conductors or each of the plurality of sensors.

18 Claims, 7 Drawing Sheets

(51) Int. Cl.
    *G01R 31/00*     (2006.01)
    *G01R 1/20*     (2006.01)
    *A01D 41/00*     (2006.01)
    *G01R 31/02*     (2006.01)

(58) Field of Classification Search
    USPC .......................................................... 324/503
    See application file for complete search history.

(56) References Cited

U.S. PATENT DOCUMENTS

| | | | | |
|---|---|---|---|---|
| 7,808,247 | B1* | 10/2010 | Lo | G01R 31/021 |
| | | | | 324/533 |
| 7,965,941 | B2* | 6/2011 | Conroy | H04B 10/071 |
| | | | | 398/102 |
| 9,148,998 | B2* | 10/2015 | Bollin | A01D 41/141 |
| 9,250,283 | B2* | 2/2016 | Johnson | G01R 31/021 |
| 2005/0192727 | A1* | 9/2005 | Shostak | B60C 11/24 |
| | | | | 701/37 |

* cited by examiner

| | Voltage of B(V) | Test 0 | Test 1 | Test 2 | Test 3 | Test 4 | Test 5 | Test 6 | Test 7 | Test 8 | Test 9 | Test 10 | Test 11 | Test 12 | Test 13 | Test 14 |
|---|---|---|---|---|---|---|---|---|---|---|---|---|---|---|---|---|
| Normal- | 3.97 | 44 | 32 | 23 | 15 | 21 | 18 | 3 | 6 | 7 | 0 | 0 | 0 | 0 | 0 | 0 |
| Normal+ | | 45 | 43 | 37 | 33 | 37 | 34 | 10 | 11 | 11 | 0 | 0 | 0 | 0 | 0 | 0 |
| OpenA- | 0.26 | 12 | 12 | 9 | 26 | 9 | 9 | 2 | 8 | 9 | 0 | 0 | 0 | 0 | 0 | 0 |
| OpenA+ | | 12 | 12 | 9 | 40 | 9 | 40 | 8 | 12 | 12 | 0 | 0 | 0 | 0 | 0 | 0 |
| OpenB- | 0.05 | 12 | 33 | 10 | 10 | 33 | 12 | 3 | 8 | 6 | 0 | 0 | 0 | 0 | 0 | 0 |
| OpenB+ | | 12 | 43 | 11 | 11 | 40 | 12 | 10 | 12 | 10 | 0 | 0 | 0 | 0 | 0 | 0 |
| OpenC- | 0.12 | 45 | 12 | 25 | 12 | 9 | 10 | 3 | 5 | 9 | 0 | 0 | 0 | 0 | 0 | 0 |
| OpenC+ | | 45 | 12 | 40 | 12 | 10 | 11 | 10 | 10 | 12 | 0 | 0 | 0 | 0 | 0 | 0 |
| OpenAB- | 0.05 | 12 | 12 | 9 | 12 | 9 | 12 | 2 | 8 | 9 | 0 | 0 | 0 | 0 | 0 | 0 |
| OpenAB+ | | 12 | 12 | 9 | 12 | 9 | 12 | 6 | 12 | 12 | 0 | 0 | 0 | 0 | 0 | 0 |
| OpenAC- | 0.05 | 12 | 12 | 9 | 12 | 9 | 12 | 2 | 8 | 9 | 0 | 0 | 0 | 0 | 0 | 0 |
| OpenAC+ | | 12 | 12 | 9 | 12 | 9 | 12 | 9 | 12 | 12 | 0 | 0 | 0 | 0 | 0 | 0 |
| OpenBC- | 0.05 | 12 | 12 | 8 | 12 | 9 | 12 | 2 | 8 | 9 | 0 | 0 | 0 | 0 | 0 | 0 |
| OpenBC+ | | 12 | 12 | 9 | 12 | 9 | 12 | 8 | 12 | 12 | 0 | 0 | 0 | 0 | 0 | 0 |
| ShortAB- | 0.06 | 47 | 36 | 47 | 33 | 32 | 32 | 3 | 6 | 7 | 0 | 0 | 0 | 0 | 0 | 0 |
| ShortAB+ | | 48 | 43 | 48 | 43 | 37 | 36 | 10 | 10 | 11 | 0 | 0 | 0 | 0 | 0 | 0 |
| ShortAC- | 0.12 | 44 | 47 | 22 | 22 | 47 | 43 | 4 | 6 | 7 | 0 | 0 | 0 | 0 | 0 | 0 |
| ShortAC+ | | 44 | 47 | 36 | 36 | 48 | 44 | 11 | 11 | 11 | 0 | 0 | 0 | 0 | 0 | 0 |
| ShortBC- | 5 | 44 | 44 | 34 | 47 | 37 | 47 | 3 | 6 | 7 | 0 | 0 | 0 | 0 | 0 | 0 |
| ShortBC+ | | 44 | 44 | 43 | 47 | 42 | 47 | 8 | 10 | 10 | 0 | 0 | 0 | 0 | 0 | 0 |
| ShortABC- | 0.03 | 47 | 47 | 47 | 47 | 47 | 47 | 4 | 6 | 7 | 13 | 7 | 28 | 7 | 7 | 7 |
| ShortABC+ | | 48 | 47 | 48 | 47 | 48 | 47 | 11 | 11 | 11 | 36 | 21 | 42 | 19 | 25 | 24 |

FIG. 7

DIAGNOSTIC SYSTEM FOR A CONTROLLER

BACKGROUND

In many mobile machines, there are provided numerous wire harnesses and sensors. As machine size and complexity increases, the need for high levels of uptime and quick problem resolution becomes more and more valuable. The cost of operating machines may amount to hundreds of dollars per hour, not including operator or technician costs. Agricultural machines, such as combine harvesters are but one example of such mobile machines.

There are many potential causes of wiring failure. For example, lack of quality control at production, or wear from use or from passing over debris (such as crop material during harvesting operations, for example), poor installation techniques, etc. Any one of these may cause a degradation or failure of the control system.

Current controllers have some wiring/sensor diagnostic ability. For example, if the signal path to a sensor is broken, the controller may indicate "Error—left sensor voltage below normal". Other examples of typical failure mode identifiers (FMI) from the SAE J1939-73 specification for defining messages to accomplish diagnostic services are identified below:

- 0—Data valid but above normal operation range
- 1—Data valid but below normal operational range
- 2—Data erratic, intermittent or incorrect
- 3—Voltage above normal, or shorted to high source
- 4—Voltage below normal, or shorted to low source
- 5—Current above normal or open circuit
- 6—Current below normal or grounded circuit
- 7—Mechanical system not responding or out of adjustment
- 8—Abnormal frequency or pulse width or period
- 9—Abnormal update rate
- 10—Abnormal rate of change
- 11—Failure code not identifiable
- 12—Bad intelligent device
- 13—Out of Calibration While this information is helpful in identifying the type of failure that has occurred, it is far from complete and does not specifically identity where the failure has occurred or other information that will lead to an effective resolution. Accordingly, there is a need for on-board diagnostic abilities which will both quickly and accurately identifies the failure and which is presented to the operator or technician in a way that leads to effective resolution.

DESCRIPTION OF THE DRAWINGS

FIG. 7 is a table showing an example of test results generated signals from tests of lines A, B and C on a single sensor.

DESCRIPTION

Figure 1:
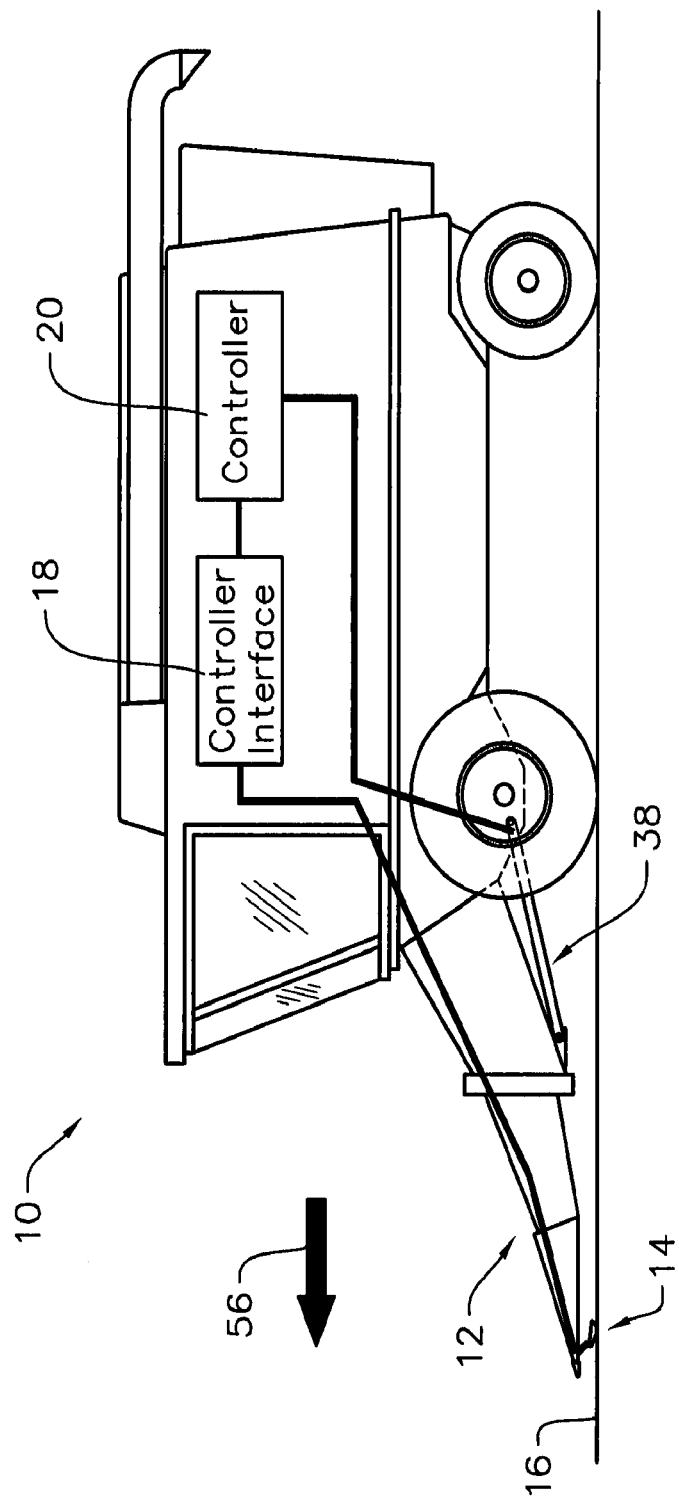
FIG. 1 is a simplified combined schematic and block diagram of a combine illustrating a head controller and controller interface according to one embodiment of the invention.

Referring to the drawings, wherein like reference numerals designate identical or corresponding parts throughout the several views, FIG. 1 illustrates, in simplified schematic and block diagram form, a machine (such as an agricultural combine harvester) indicated generally by reference numeral 10 having an attachment 12 (such as a "header") mounted thereon. Sensors 14 (such as height sensors) are mounted on the attachment 12 and are in electrical communication with a controller interface 18 and a controller 20. The controller 20 is responsive to signal outputs from the sensors 14 mounted to the attachment 12 and provides suitable electrical control signals to an electrically actuated, hydraulic control system 38. In this embodiment, the signal outputs from the height sensors 14 are variable in magnitude with respect to changes in height of the header attachment 12 relative to the ground surface 16 to effect raising and lowering of the header attachment 12 with respect to the ground surface 16 or to effect lateral tilt of the header attachment as the combine harvester 10 traverses a field in the direction of arrow 56.

While this description and drawing figures reference and depict an agricultural combine harvester and height sensors used to effect raising and lowering of the header attachment, it should be understood that the system and method described herein is suited for any machine having a plurality of sensors configured to sense parameters where it may desirable to determining faults between a controller and the sensors. Accordingly, as used herein, the term "machine" should be understood to include any type of agricultural, industrial, or other machine. Additionally, for purposes of this description, the term "sensor" should be understood to include any type of contact sensor or non-contact sensor that is capable of generating output signals, which may or may not be variable in magnitude depending on what parameters are being sensed. For example, contact sensors may include, but are not limited to, surface contacting pivoting arms coupled to rotational or position sensors for detecting the angular or linear position of the arms. Non-contact sensors may include, but are not limited to ultrasonic or laser sensors. Furthermore, as used herein, the term "signal output" should be understood as meaning or including any signal value or signal characteristic generated by a sensor 14, including voltage, current, pulse width, etc. as well as digital signals.

Figure 2:
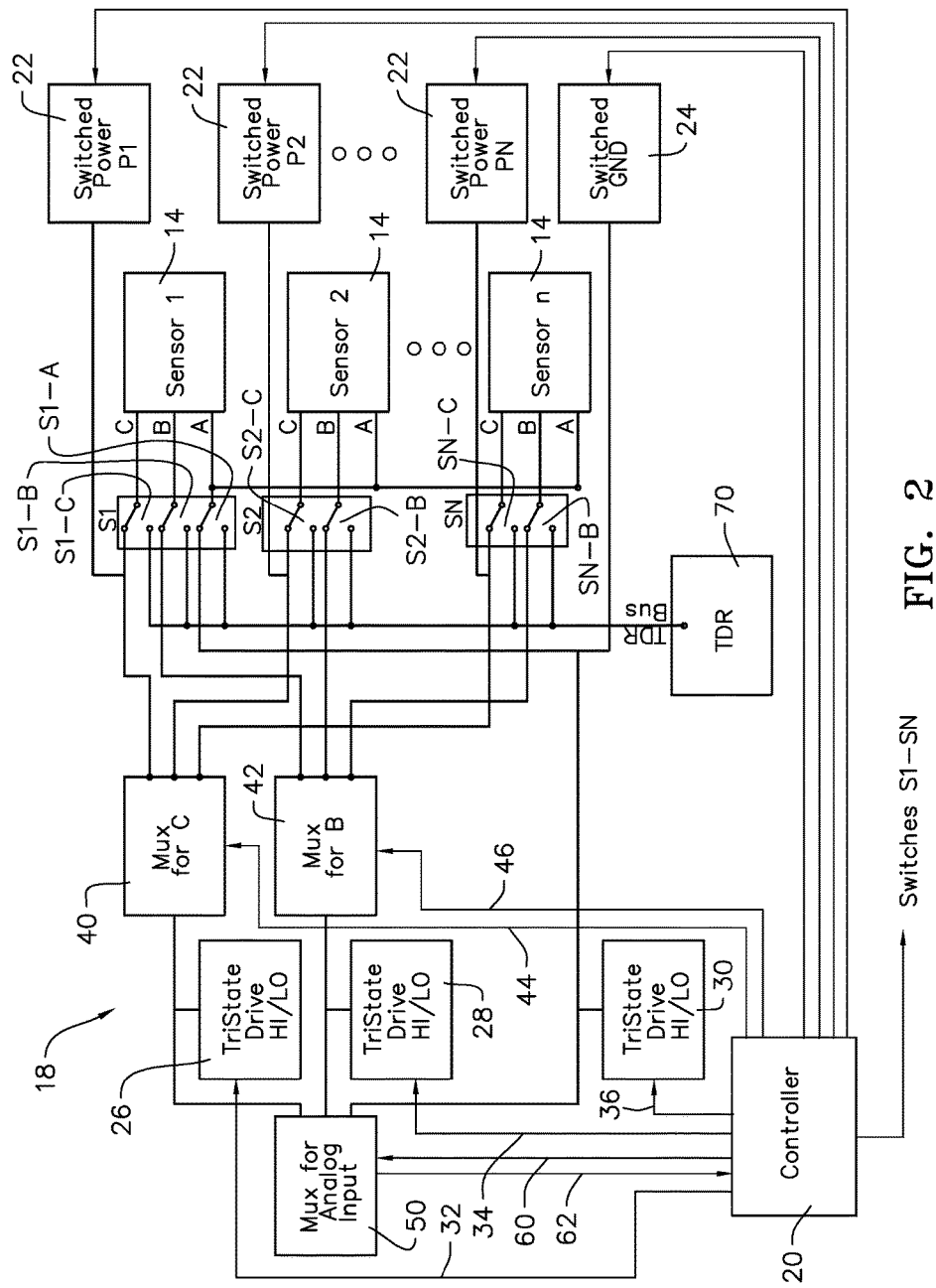
FIG. 2 is combined schematic and block diagram of the controller and controller interface according to one embodiment of the invention.
Figure 3:
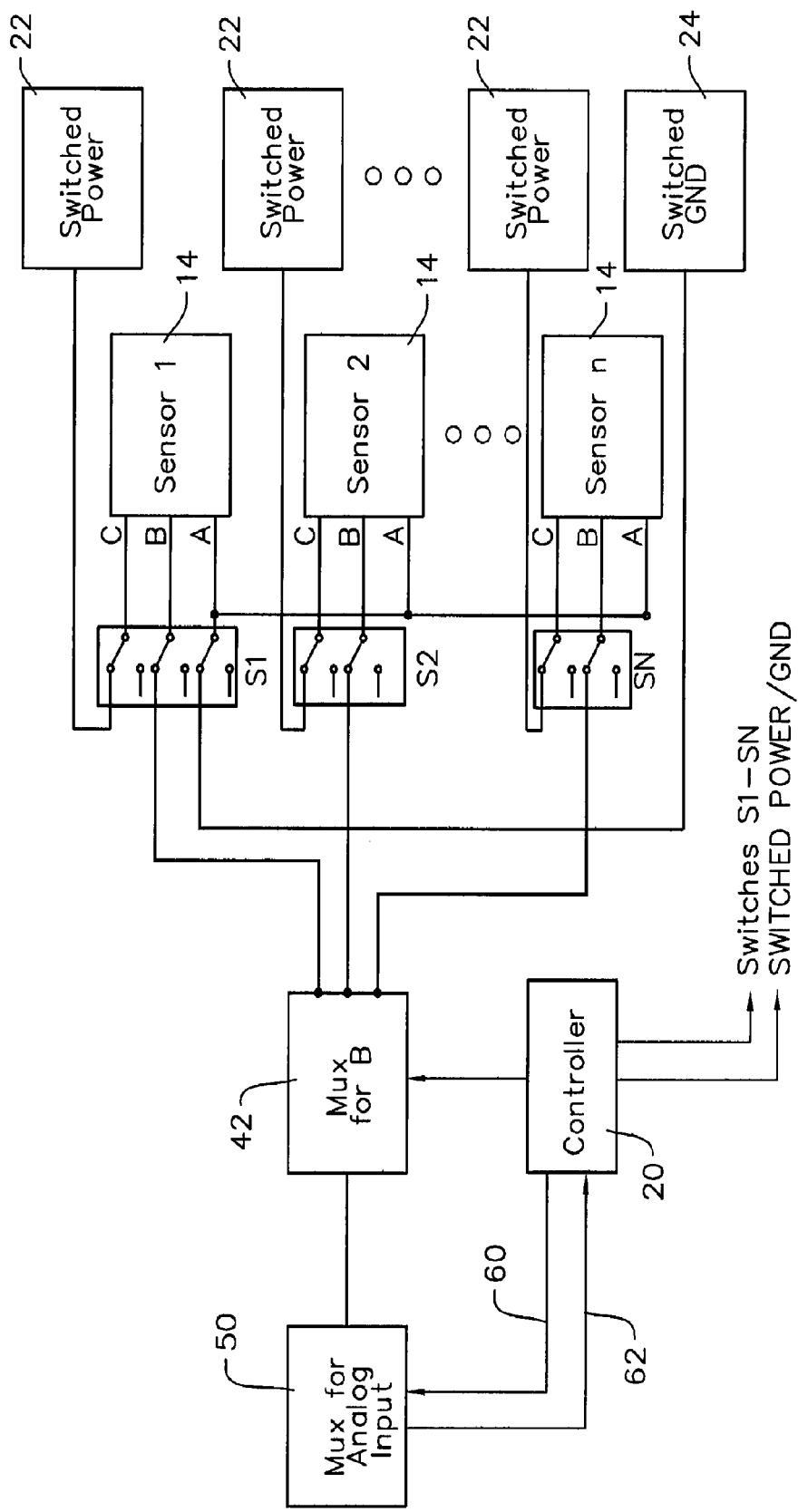
FIG. 3 is combined schematic and block diagram of the controller and controller interface during normal operation, with sensor signals configured to be routed back to the controller.

Referring to FIG. 2, there is shown a schematic and block diagram of one embodiment of the controller interface 18 and controller 20. As shown in FIG. 3, during normal operation of the machine 10, sensor signals from sensors 14 are routed back to controller 20 via switches and Muxs.

Figure 4:
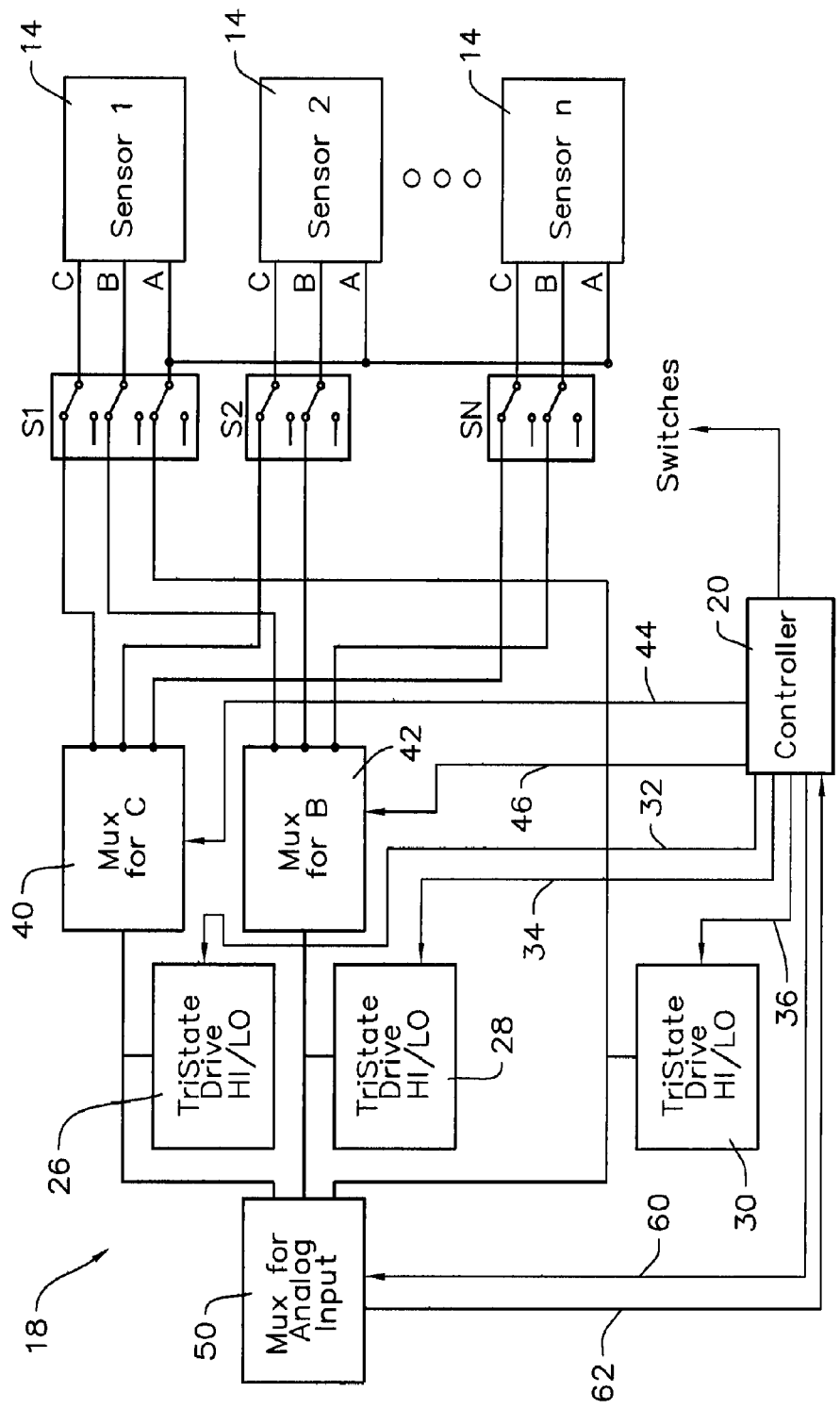
FIG. 4 is combined schematic and block diagram illustrating the interface configured in a testing mode to selectively deliver a test signal to each conductor of each sensor, whereby a generated characteristic signal is returned back to the controller for analysis.

During a testing mode, as shown in FIG. 4, the interface 18 is configured to generate and selectively couple a test signal to each of the sensor conductors, namely, the wires of the wire harness extending between the controller interface 18 and the plurality of sensors 14. The test signal, such as a 5V pulse, is communicated, to each of the wires A, B, C of each of the sensors 14 labeled Sensor 1-$n$, one at a time, whereby a returned characteristic signal generated by the respective sensor 14 or wiring in response to the test pulse is then selectively routed via one of the other wires back to the controller 20 for diagnostic testing of faults. Many different faults may be detected, including, but not limited to, a "sensor power wire open" which may indicate a poor connection, a "sensor signal wire shorted to the sensor power wire" which may indicate wire damage from a pinch point, and "sensor power and ground wires swapped" which may indicate improper installation technique. By providing for the selective routing of a test signal to each of the wires, whereby the other wires of the respective sensor are used to retrieve/route the returned characteristic signal, each and every sensor wire, as well as each and every sensor, can be analyzed by controller 20 to provide a more accurate and robust diagnostic system allowing operators to better isolate faults, more quickly to reduce down time and costs.

Referring back to FIG. 2, interface 18 is operably connected between controller 20 and each of the sensors 14. Each of the sensors 14 has an associated power source 22 that can be selectively coupled to line C of the respective sensor via an associated switch. Switch banks S1-Sn have associated individually controllable switches controlled by controller 20, where switch bank S1 has associated switches S1-A, S1-B and S1-C, while the remaining switch banks have two switches since the grounds are tied together, where switch S2 has individual switches S2-B and S2-C, and switch Sn likewise has individually controllable switches Sn-B and Sn-C. Power Switched ground 24 is selectively coupled to line A of each of the sensors 14 by controller 20 by switch S1-A, where each of these ground lines are tied together to form a ground bar. This switched power and switched ground enables each to be removed from the sensors during the diagnostic testing of the sensors and sensor lines as will now be described in more detail.

Associated with each sensor 14 is a TriState Drive Hi/LO generally shown at 26, 28 and 30. Each of the TriState circuits 26, 28 and 30 may comprise of a pull-up resistor selectively coupled to power, which may generate, for instance, a 5V pulse that is generated in response to a control signal provided on respective control lines 32, 34 and 36 generated by controller 20. Alternatively, other test signals may be generated by the circuits 26, 28 and 30, such as analog signals, and limitation to a TriState Drive providing a digital pulse and so forth is not to be inferred. Still referring to FIG. 2, interface 18 includes a controllable Mux 40, labeled Mux for C, configured to selectively couple the test signal from TriState Drive HI/LO 26 to each of the lines C of the sensors 14 via the respective switch C of switch bank S1-Sn. For instance, the controller 20 can generate a control signal on line 44 to instruct Mux 40 to couple the test signal from TriState Drive HI/LO 26 to the line C of Sensor 2 via switch S2-C, or the test signal to the line C of sensor n via switch Sn-C. The controller 20 controls each of the switches of switch banks S1-Sn as it controls the output of the Mux 40 to selectively control the coupling of the test signal to each of the lines C, whereby line C is configured as the power line of each sensor 14.

Similarly, a Mux for B shown at 42 is configured to selectively provide the test signal from the TriState Drive HI/LO 28 to a selected line B of one of the sensors 14 via the corresponding switch B of switch bank S1-Sn. For instance, the controller 20 can instruct the Mux for B via control line 46 to selectively provide the test signal from TriState Drive HI/LO 28 to the line B of Sensor 1 via switch S1-B, whereby line B of each sensor 14 is the sensor signal line. It is noted there is not provided a Mux for lines A because the TriState Drive HI/LO 30, when instructed by controller 20 via control line 36, provides the test control signal to each commonly tied lines A of sensors 14 via switch S1-A.

Still referring to FIG. 2, a Mux for Analog Input is generally shown at 50. Mux 50 is configured to be controlled by controller 20 via control line 60 so as to receive and route a received characteristic signal from lines A, B and C of the sensors 14 to the controller 20 via line 62. In addition, the Mux for Analog Input 50 can also selectively receive the test signal generated by the respective TriState Drive HI/LO 26, 28 and 30 and route it to the controller 20 via line 62, such that the controller 20 can compare the generated test signal to the returned characteristic signal to perform signal processing analysis and determined the specifics of any detected faults or irregularities in the conductors/wires and the sensors 14. Thus, for instance, the controller 20 is configured to send a test signal to each of the signal lines A, B, C for each of the sensors 14 as described above, and monitor the other two lines to which the test signal is not injected, to determine the returned characteristic signal. For instance, this test signal could be injected to the power line C of a sensor, and the characteristic signal can be sensed from other lines A or B of the respective sensor. Likewise, the test signal could be injected into line B, which is the sensor signal of the sensor, and the returned characteristic signal can be sensed from either or both lines A or C of the respective sensor. The test signal can be routed to each of lines A, and the returned characteristic signal can be sensed from either or both lines B or C of the respective sensor. Advantageously, the interface circuitry 18 is configured such that a test signal can be injected into each line of the sensor, and each of the other lines can be sensed such that two returned characteristic signals are generated for each injected signal, allowing the controller 20 to analyze the signal lines, and the sensors, to determine a fault as well as the type of fault and the possible location thereof. In addition to providing test pulses to each of the sensor lines A, B and C, each of the sensor lines A, B and C may be allowed to float by the respective TriState Drive HI/LO, allowing the controller 20 to read each of the lines A, B and C and compare the results from all readings to known and/or expected values.

Figure 5:
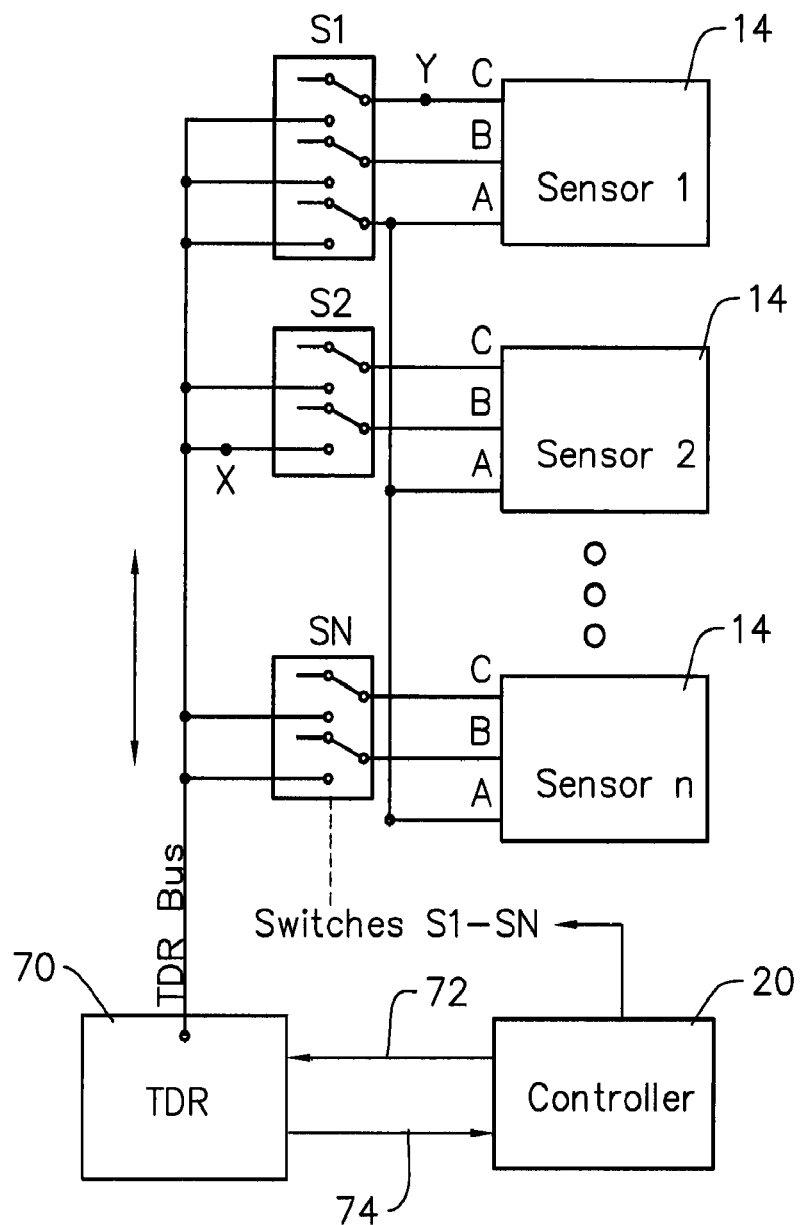
FIG. 5 is combined schematic and block diagram illustrating the fault analysis circuit configured to perform time domain reflectometry (TDR) on the sensor conductors identified to have a fault to determine an specific location of the fault in the conductor.

Referring now to FIG. 5, there is shown an additional testing circuitry at 70 shown to be a time domain reflectometer (TDR) including a signal generator and analyzer configured to test each of the sensor lines A, B, C of sensors 14 via the respective switches of switch banks S1-Sn, as shown. Advantageously, the TDR 70 is configured to perform a test on the sensor and/or sensor line that is determined by controller 20 and interface 18 to have a fault or irregularity as previously described in reference to FIGS. 2-4. For instance, if controller 20 and interface 18 determine there is fault or irregularity with sensor line B of sensor 2, controller 20 switches switch S2-B and generates a control signal on control line 72 such that TDR analyzer 70 responsively generates a TDR test signal via switch S2-B on line B to determine an exact location of a fault between TDR 70 on the respective line B of sensor 2. For instance, at location X as shown in FIG. 5, which is reported on line 74 to controller 20. Likewise, a fault can be precisionally determined in each of the power lines C and ground lines A of the respective sensors, such as shown at location Y. The TDR circuitry 70 provides, for instance, a very accurate distance of the fault X and Y from the TDR signal source to allow a technician to more quickly isolate that portion of the wire harness that may have a fault. An example of a suitable TDR is a PIC18F25K22-I/ML microchip made by Microchip and available from Digikey. The advantageous application of TDR analysis in a mobile controller, and in conjunction with the fault analysis control and interface as previously described, allows technicians and operators to quickly identify and repair faults in equipment.

Figure 6:
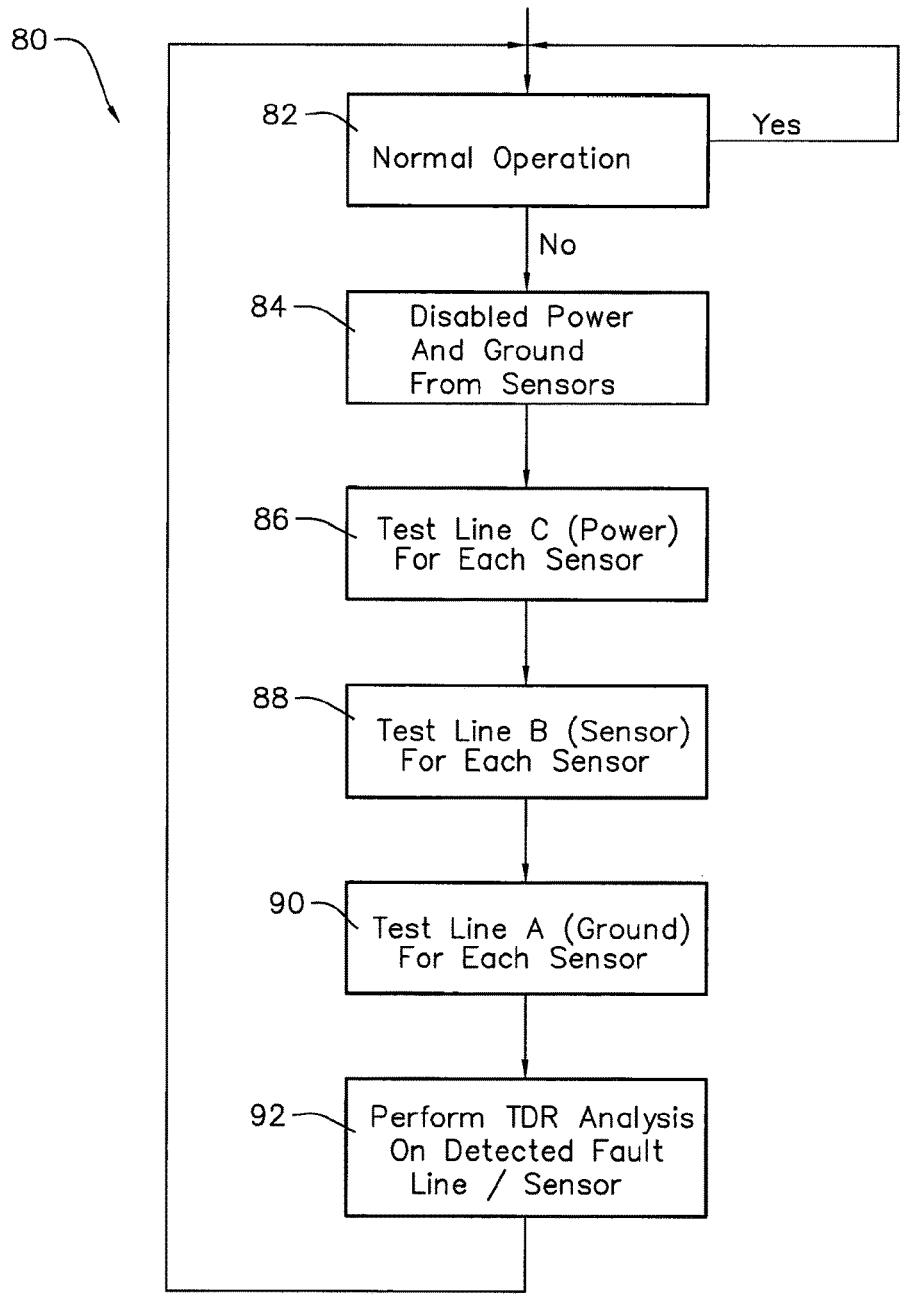
FIG. 6 is an algorithm executed by the controller to test the sensor conductors and the sensors to accurately identify a fault, and the location of the fault.

Referring now to FIG. 6 in view of FIG. 4, there is shown an algorithm at 80 illustrating a testing sequence for analyzing the sensors and the sensor wires according to the present invention.

The algorithm is configured during normal operation of the mobile machine at step 82 such that the controller 20 controls the sensors 14 and reads the sensor values thereof as the mobile machine traverses. When a testing mode is manually selected by a user at step 84, or automatically enabled by the controller 20, controller 20 disables power and ground from each of the sensors S1-Sn by disabling each switched power 22 and switched ground 24.

Next, at step 86, the controller 20 instructs the TriState Drive HI/LO 26 via control line 32 to provide a test pulse, such as 5V, via Mux for C 40 as configured by control line 44, and switch S1-C as controlled by controller 20, to line C of sensor 1. The controller 20 also configures the Mux for B 42 via control line 46 to route a generated characteristic signal from line B of the sensor 1 via switch S1-B to the Mux for Analog Input 50, and configures the Mux for Analog Input 50 via control line 60 to route the characteristic signal to controller 20 via line 62 for analysis. Thereafter, a generated characteristic signal from line A of sensor 1 is routed via switch S1-A and the Mux for Analog input 50 to the controller 20 for analysis, as controlled by control line 60. As previously mentioned, the generated characteristic signals generated from lines B and A are compared to expected voltage levels, waveforms or other predetermined characteristics.

The following tests are illustrative examples of tests that may be performed on the sensor lines A, B and C of each of the sensors 14. FIG. 7 is a table showing an example of the results that are analyzed from performing these tests on a single sensor. These tests are run in response to a user request, or automatically enabled by the controller 20, wherein the controller 20 runs through a series of initial tests concerning three values A=Sensor Ground circuit, B=Signal Line and C=Power Line. The tests consist of:

Test 0: driving power to A (Gnd) and reading B (Sig).
Test 1: driving power to A (Gnd) and reading C (Pwr).
Test 2: driving power to B (Sig) and reading A (Gnd).
Test 3: driving power to B (Sig) and reading C (Pwr).
Test 4: driving power to C (Pwr) and reading A (Gnd).
Test 5: driving power to C (Pwr) and reading B (Sig).
Test 6: while none are driven, reading A (Gnd).
Test 7: while none are driven, reading B (Sig).
Test 8: while none are driven, reading C (Pwr).

Additionally, if unique results are not identified by controller 20 that isolate a fault, then the controller 20 will perform additional tests 9-14.

Test 9: driving power to A (Gnd) and reading B (Sig) and driving ground to C (Pwr).
Test 10: driving power to A (Gnd) and reading C (Pwr) and driving ground to B (Sig).
Test 11: driving power to B (Sig) and reading A (Gnd) and driving ground to C (Pwr).
Test 12: driving power to B (Sig) and reading C (Pwr) and driving ground to A (Gnd).
Test 13: driving power to C (Pwr) and reading A (Gnd) and driving ground to B (Sig).
Test 14: driving power to C (Pwr) and reading B (Sig) and driving ground to A (Gnd).

These additional tests run above tests for one sensor and store the "read" values in an array of structures. When the tests are run for sensors, then this test will be called in a loop for all sensors. A normal Diagnostic Sensor test collects the readings for all sensors first, because while the test is reading the sensors, the controller 20 cannot read the sensors 14. During the test mode, the controller 20 uses the last known value of the sensors 14 during operation. By taking all of the readings first, the system is able to read the sensors sooner and shorten the diagnostic time. During a normal test, after all readings are taken, a separate function analyzes the readings and reports the results.

Tests 0-8 are used to determine opens and shorts of the plurality of conductors. The Values in each test are in tenths of a volt, i.e. Value 44=4.4V. The voltage is correlated to the status of a conductor, such as an open conductor or a shorted conductor. Tests 9-14 are used for potentiometer sensors and are run with caution on the hall effect sensors. The tests are run at intervals and may be, in one example, once per second.

The following are logic rules for analyzing the Values/results table, although other logic rules may apply in other embodiments:

1. A range of Values less than 15 are used as valid pull to values for an open conductor.
2. A range of Values greater than 45 are valid numbers for a shorted conductor.

Thereafter, the controller 20 tests line C of Sensor 2 by configuring Mux for C 40 via control line 44 to output the test signal to switch S2-C, and configures switch S2-C to provide the test signal to line C of Sensor 2. The controller 20 configures the Mux for B 42 via control line 46 to route the generated characteristic signal from line B of Sensor 2 via Switch S2-B to the Mux for Analog Input 50, and configures the Mux for Analog Input 50 via line 62 to provide the characteristic signal to controller 20 for analysis. Thereafter, the generated characteristic signal from line A of Sensor 2 is routed to via switch S1-A to controller 20 by controlling the Mux for Analog Input 50. This algorithm 80 continues to test line C of each sensor such that the characteristic signals from lines B and A of each sensor are routed to controller 20 for testing.

At step 88, the controller 20 tests line B of Sensor 1 by configuring the Mux for B 42 to send a test signal from TriState Drive HI/LO 28 via Switch S1-B to line B of the Sensor 1, and then the generated characteristic signal is routed from line C of Sensor 1 via switch S1-C to the Mux to C 40 and the Mux for Analog Input 50 to controller 20 using control lines 44 and 60 for analysis. Thereafter, the controller 20 routes the generated characteristic signal from line A of Sensor 1 via switch S1-A to the Mux for Analog Input 50 to the controller 20 for analysis. Thereafter, the controller 20 tests line B of Sensor 2 by controlling the Mux for B 42 and switch S2-B to deliver the test signal. The generated characteristic signal from each of lines C and A of Sensor 2 are routed via respective Switches S2-C and S1-A to controller 20 for analysis as described above. This algorithm 80 continues to test line B of each sensor such that the characteristic signals from lines C and A of each sensor are routed to controller 20 for testing.

At step 90, the line A of each sensor 14 is tested. The controller 20 instructs the TriState Drive HI/Lo 30 to generate the test signal, and controls the switch S1-A to provide the test signal to line A of each sensor simultaneously as the line A of each sensor is tied together. The controller 20 then routes the generated characteristic signal from line C of Sensor 1 via Switch S1-C back to the controller for analysis via Mux for C 40 and Mux for Analog Input 50 as described. The controller 20 then routes the generated characteristic signal from line B of Sensor 1 via Switch S1-B and Mux for B 42 and Mux for Analog Input 50 to controller 20 for analysis. Then, controller 20 routes the characteristic signal from line C of Sensor 2 via Switch S2-C, then from line B of Sensor 2 via Switch S2-B, and so on for each sensor including Sensor Sn.

At step 92, controller 20 controls TDR 70 to perform TDR analysis on each of the lines and sensors that are determined to have a fault during any of the steps 84, 86, 88 and 90 as previously described. Thereafter, the algorithm routes back to normal operation at step 82, as shown in FIG. 6. It is noted that each of the switches of switch banks S1-Sn are shown in FIGS. 2-5 in their normal position for normal operation of the sensors and also for testing of the conductors A, B and C, whereby each switch is individually switched only when the TDR test is performed to select an individual conductor associated with a switch for testing.

The foregoing description is presented to enable one of ordinary skill in the art to make and use the invention and is provided in the context of a patent application and its requirements. Various modifications to the preferred embodiment of the system, and the general principles and features of the system and methods described herein will be readily apparent to those of skill in the art. Thus, the present invention is not to be limited to the embodiments of the system and methods described above and illustrated in the drawing figures, but is to be accorded the widest scope consistent with the spirit and scope of the appended claims.

The invention claimed is:

1. A mobile machine having a controller and an on-board diagnostic interface, the mobile machine comprising:
    first and second sensors each disposed on the mobile machine, each of the first and second sensors configured to sense a parameter as the mobile machine operates, each of the first and second sensors having a plurality of conductors coupled thereto, and wherein the first sensor is configured to generate a first sensor signal as a function of the sensed parameter and wherein the second sensor is configured to generate a second sensor signal as a function of the sensed parameter;
    a controller disposed on the mobile machine and electrically coupled to each of the first and second sensors, the controller being responsive to the generated first and second sensor signal to effect a change in an operating condition of the mobile machine as the mobile machine operates; and
    a diagnostic interface disposed on the mobile machine and electrically coupled between the controller and the first and second sensors, the diagnostic interface having a testing mode wherein during the testing mode the diagnostic interface is configured to:
        (a) selectively communicate a first test signal to one of the plurality of conductors coupled to the first sensor to cause the first sensor to generate a first returned characteristic signal, whereupon the first returned characteristic signal is selectively routed via at least one of the other ones of the plurality of conductors coupled to the first sensor back to the controller, whereupon the controller is configured to detect existence of a fault in the plurality of conductors coupled to the first sensor as a function of the first returned characteristic signal; and
        (b) selectively communicate a second test signal to one of the plurality of conductors coupled to the second sensor to cause the second sensor to generate a second returned characteristic signal, whereupon the second returned characteristic signal is selectively routed via at least one of the other ones of the plurality of conductors coupled to the second sensor back to the controller, whereupon the controller is configured to detect existence of a fault in the plurality of conductors coupled to the second sensor as a function of the second returned characteristic signal.

2. The mobile machine of claim 1, wherein the controller is further configured to detect existence of a fault in the first sensor as a function of the first returned characteristic signal and to detect existence of a fault in the second sensor as a function of the second returned characteristic signal.

3. The mobile machine of claim 2, further comprising testing circuitry configured to determine a location of the detected fault.

4. The mobile machine of claim 3, wherein the testing circuitry comprises a transmitter and receiver configured to conduct time domain reflectivity (TDR) with each of the plurality of conductors of the first sensor and each of the plurality of conductors of the second sensor.

5. The mobile machine of claim 1, wherein the diagnostic interface comprises a plurality of switches configured to selectively route the test signal to a selected one of the plurality of conductors coupled to the first sensor and to a selected on of the plurality of conductors coupled to the second sensor.

6. The mobile machine of claim 5, wherein the switches are configured to selectively route the first returned characteristic signal back to the controller and to selectively route the second returned characteristic signal back to the controller.

7. The mobile machine of claim 1, wherein the diagnostic interface comprises at least one Mux coupling the first test signal to the one of conductors coupled to the first sensor and the at least one Mux coupling the second test signal to the one of conductors coupled to the second sensor.

8. The mobile machine of claim 7, wherein the diagnostic interface comprises at least one Mux coupling the first returned characteristic signal to the controller and the at least one Mux coupling the second returned characteristic signal to the controller.

9. The mobile machine of claim 1, wherein the controller comprises a signal processor configured to compare the first and second returned characteristic signals to a table of predetermined signatures, and wherein the controller responsively determines a type of fault.

10. The mobile machine of claim 1, wherein the mobile machine is an agricultural harvester and the first and second sensors are height sensors are disposed on a header attachment coupled to the agricultural harvester, and wherein the effected change in the operating condition is a height of the header attachment above a soil surface.

11. The mobile machine of claim 9, wherein the type of fault is one of an open conductor or a shorted conductor.

12. The mobile machine of claim 9, wherein the plurality of predetermined signatures comprise a range of values, where a first range of the values is indicative of the type of fault being an open conductor, and a second range of the values is indicative of the type of fault being a shorted conductor.

13. The mobile machine of claim 12, wherein the values are correlated to a voltage measured on said plurality of conductors.

14. The mobile machine of claim 12, wherein the interface comprises at least one Mux configured to communicate the first test signal to one of the plurality of conductors coupled to the first sensor and the at least one Mux configured to communicate the second test signal to one of the plurality of conductors coupled to the second sensor.

15. The mobile machine of claim 14, wherein the interface comprises at least one Mux configured to couple the first returned characteristic signal to the controller and the at least one Mux configured to couple the second returned characteristic signal to the controller.

16. The mobile machine of claim 15 wherein the mobile machine is an agricultural harvester and the first and second sensors are height sensors are disposed on a header attachment coupled to the agricultural harvester, and wherein the effected change in the operating condition is a height of the header attachment above a soil surface.

17. The mobile machine of claim 1, whereupon the first returned characteristic signal is selectively routed via each of the other ones of the plurality of conductors coupled to the first sensor, and whereupon the second returned characteristic signal is selectively routed via each of the other ones of the plurality of conductors coupled to the second sensor.

18. A method of diagnosing multiple conductors of a sensor on a mobile machine, the method comprising:

a controller, a diagnostic interface and a sensor disposed on the mobile machine, the sensor configured to sense a parameter as the mobile machine operates, the sensor having multiple conductors coupled thereto, and wherein the sensor is configured to generate a sensor signal as a function of the sensed parameter, the controller electrically coupled to the sensor, the controller being responsive to the generated sensor signal to effect a change in an operating condition of the mobile machine as the mobile machine operates, the diagnostic interface electrically coupled between the controller and the sensor, the diagnostic interface having a testing mode, whereby during the testing mode:

the controller generating a first test signal;

the diagnostic interface routing the first test signal to a first one of the multiple conductors coupled to the sensor;

the diagnostic interface routing a first return signal from the first test signal through a second one and a third one of the multiple conductors of the sensor and back to the controller;

the controller generating a second test signal;

the diagnostic interface routing the second test signal to the second one of the multiple conductors coupled to the sensor;

the diagnostic interface routing a second return signal from the second test signal through the first one and third one of the multiple conductors of the sensor and back to the controller;

the controller diagnosing the first, second and third conductors as a function of the first and second return signals.

* * * * *